United States Patent
Schmutz et al.

[11] Patent Number: 6,164,448
[45] Date of Patent: Dec. 26, 2000

[54] MAGAZINE FOR THE FIXATION OF SMALL COMPONENTS

[75] Inventors: Wolfgang Schmutz, Zimmern; Guenter Ernst, Dresden; Udo Berg, Darmstadt; Klaus-Peter Kaemper, Roetgen; Klaus Renner, Emmingen-Liptingen; Ulrich Rothmaier; Juergen Rudischhauser, both of Tuttlingen; Ralf Grimme, Pleidelsheim; Dirk Schlenker, Schwieberdingen; Achim Stock, Aalen; Wolfgang Schaefer, Nuertingen; Klaus Irion, Tuttlingen, all of Germany

[73] Assignee: Karl Storz GmbH & Co. KG, Germany

[21] Appl. No.: 09/043,857

[22] PCT Filed: Sep. 27, 1996

[86] PCT No.: PCT/DE96/01850

§ 371 Date: Mar. 12, 1999

§ 102(e) Date: Mar. 12, 1999

[87] PCT Pub. No.: WO97/11888

PCT Pub. Date: Apr. 3, 1997

[30] Foreign Application Priority Data

Sep. 27, 1995 [DE] Germany .................. 195 35 971

[51] Int. Cl.[7] .................. B65D 73/00; B65D 1/36; A47F 7/00
[52] U.S. Cl. .............. 206/488; 206/562; 206/818; 211/60.1
[58] Field of Search ............... 206/486, 488, 206/490, 562, 563, 564, 565, 818; 211/60.1

[56] References Cited

U.S. PATENT DOCUMENTS

| 1,278,354 | 9/1918 | Kendis | 206/488 |
| 2,366,886 | 1/1945 | Van Tuyl | 206/562 X |
| 3,405,377 | 10/1968 | Pierce | 206/818 X |
| 3,472,365 | 10/1969 | Tiedema . | |
| 3,871,936 | 3/1975 | Boyer et al. . | |
| 3,968,873 | 7/1976 | Pomeroy et al. . | |
| 4,099,611 | 7/1978 | Feibelman . | |
| 4,282,975 | 8/1981 | Ovadia | 206/818 X |
| 4,693,370 | 9/1987 | Aceti | 206/488 |
| 5,131,535 | 7/1992 | O'Connor et al. | 206/486 X |

FOREIGN PATENT DOCUMENTS 1236131  6/1960  France .

*Primary Examiner*—Bryon P. Gehman
*Attorney, Agent, or Firm*—St. Onge Steward Johnston & Reens LLC

[57] ABSTRACT

A magazine for the fixation of small components such as those used in micro system technology and light engineering. The magazine includes a magazine base carrier with holders for the small components. The magazine has recipients to form the holders, each recipient being situated at defined and known locations and containing releasable fixing units, each of which is provided with securing structure for securing a small component.

19 Claims, 6 Drawing Sheets

MAGAZINE FOR THE FIXATION OF SMALL COMPONENTS

FIELD OF THE INVENTION

The present invention relates to a magazine for the fixation of small components secured to a magazine base in a predetermined pattern.

Magazines of this type are employed for the fixation of and storage of a great variety of different small components, such as used in micro system technology and in light engineering. Generic magazines may serve, if need be in conjunction with additional cassettes or boxes, as transport or storage containers or as an intermediate storage unit during a production step in an interlinked production system.

BACKGROUND OF THE INVENTION

Transporting and placing small parts at disposal in a unordered state is known. This unordered state of components does not allow precise positioning of these parts for assembly or manufacturing processes without the additional separation and handling. Moreover, transporting components as bulk material may damage the components. This is especially the case with components in micro system technology and in light engineering.

Furthermore, providing a carrier with multiple pockets covered with lids, so-called trays, is also known. Carriers of this type are usually used only as transport containers for stored components. Automatic further processing of components in assembly and production is only possible with additional costs and effort, because removing covers can only be automated with great difficulty, and in addition complicates handling the single components, by way of illustration with simple gripper systems. A complex gripper system, which for example has to be provided with an image processing device for determining the orientation and the position of the components, is required for handling and removing the components. Moreover, a fundamental disadvantage of these carriers with pockets is that due to the design of the pockets, the components located in the magazine are not accessible from all sides; however for processing, inspection or cleaning, the small components have to be accessible from all sides. In practice at any rate, processing the small components inside the carrier with pockets is impossible.

Furthermore, fixing small components on foil belts or so-called gel-paks by means of an adhesive layer is known. The gel-paks respectively foil belts possess no articulated structure and therefore are only suited to a limited extent for automated processing production. Placing the small components at disposal, by way of illustration for automated assembly, in this case, too, has to occur by means of additional handling steps. This again requires suited grippers. These grippers have to be provided with an additional image processing, because the location of the small components is only roughly defined on the foil belt and no defined pickup of the small components can otherwise occur. In this case, too, measures which make the small components accessible from all sides, by way of illustration in production, are not possible, because at least one side of the small component lies on the adhesive surface and is not freely accessible. An additional disadvantage are the residues of adhesive adhering to the small components, which gains in significance with the increasing miniaturization of components and practically does not allow use of such gel-paks or foil belts in micro systems technology.

Magazines for the fixation of small components, on which the formulation of the generic part of claim is based, are known from EP 0 392 331 A1 or DE 41 16 866 A1:

From EP 0 392 331 A1, a magazine for jewelry stones or other small components is known, which as a magazine base carrier is provided with a magazine strip composed of a plastic foil provided with recesses for the reception of jewelry stones. The recesses are adapted at least to one partial profile of the jewelry stones to be positioned and disposed in rows.

As holding means, retaining lips are provided adjacent to the recesses. In a closed position, these retaining lips grip the positioned jewelry stones and thereby fix their position. For this purpose, the retaining lips of the magazines known from EP 0 392 331 A1 are pretensioned in a resilient manner and hold the jewelry stones in the fixed position after the stones have been pressed into the recesses. Multiple parallel rows of recesses for the reception of the jewelry stones are possible so that even leaf-shaped respectively matrix-shaped type embodiments are possible whose length and width are about the same.

Accordingly, the retaining lips can be disengaged from the jewelry stones by means of elastic deformation. For this purpose, the retaining lips are disposed continuously in the longitudinal or transverse direction of the magazine strip and are provided with a downward, continuous, open section. For removal of the jewelry stones, the exterior retaining lips are bent outward, i.e. away from the stones. In this way, the retaining lips are disengaged from the jewelry stones so that the stones can be removed. In particular, the retaining lips can be disengaged from the jewelry stones by expanding the magazine strip in a transverse direction to the disposition direction of the retaining lips. The stones can then be removed by means of a dapper or a vacuum suction cup. However, expansion makes it difficult to remove small components in random sequence, i.e. in the event of matrix array to remove them successively from different rows and columns.

The operation steps of inserting the filled magazine strip into the guide rails, moving the magazine strips along the guide rails and the subsequent removal can occur completely automated due to the open retaining lips. Transport of the magazine strip can, by way of illustration, occur by means of a roller disposed on the bottom side of the strip, with the conveyor devices engaging from below behind the recesses and moving the magazine strips forward. The magazine strips can also be used for cuboid electronic components.

The generic magazine known from EP 0 392 331 A1 has a number of drawbacks: the to-be-stored small components are inserted into recesses whose inner contour is matched to the outer held securely in an interlocking and stressfree manner in this way, they are not accessible in the magazine for processing steps. For processing, but also for inspection and cleaning, the small components have to be removed from these recesses in the magazine. Moreover, the magazine is suited only for one shape and one size of the small components to be stored. Use of the magazine in mixed production or for dispatching different small components is therefore impossible.

A generic type magazine for the fixation of small components, namely jewelry stones, is also known from DE 41 16 866 A1, which is provided with a magazine strip as the magazine base carrier in which through-going holes are provided into which the jewelry stones are inserted. The holding means are formed by the magazine base carrier being provided with a sandwich structure, the middle layer of which is soft and has in the bordering wall of each hole a ring-shaped groove into which the diamond-shaped jewelry stones are pressed. Although this magazine permits inspection of the stored small components, it has the drawback that the design of the firmly applied holding means only permits storing small components with a specific outer contour and, in addition, a fixed, predetermined diameter. Storing optical micro components, such as by way of illustration rod lenses as are used for endoscopes, is impossible in magazines of this type. Processing small components is also only possible to a limited extent due to the unstable holding means. In particular, it cannot be adapted to different shapes of the components.

SUMMARY OF THE INVENTION

The object of the present invention is to further improve a magazine for the fixation of small components in such a manner that with minimal retrofitting, small components of any shape and for the most part any size, if need be even mixed in one magazine, can be stored in such a manner that each small component has a defined location so that in addition to manual loading and removal even automated loading and removal in random sequence is possible.

An element of the present invention is that for forming the holding means, the magazine base carrier is provided with recipients, which are disposed at defined, known locations and hold releasable fixation elements of which each is provided with securing means for each to-be-fixed small component.

As the recipients for the fixation elements and therefore also the fixation elements are disposed at defined, known locations, loading, handling the small components in the magazine and their removal can not only occur manually but also, preferably, with a handling device regulated, in particular, by a control unit which can be freely programmed. The handling device may, by way of illustration, be provided with suited grippers, a cleaning device, a surface processing means respectively tools etc. Preferred is if the recipients on the magazine base carrier are disposed in a pattern and especially in a form, which permits simple programming of a control unit for loading, handling and/or removing the stored small components.

In particular, the recipients may be disposed in the form of a matrix composed of square, rectangular or trapezoid elements, or in the form of a honeycomb composed of hexagonal elements. Furthermore, other orderly arrangements, such as linear, concentric or (semi) circular arrangements, are also possible. In the case of concentric respectively (semi)circular arrangements, a simple rotary indexing table may be used to move the magazine.

As the recipients hold the fixation elements in a releasable manner, the fixation elements can be easily replaced. This replacement can, by way of illustration, serve to retrofit the magazine for small components with a different shape. Moreover, a small component can also be removed with its respective fixation element.

In any event, the invented magazine can be employed as a storage respectively transport unit and/or as an intermediate storage unit in interlinking production, with random loading and removal without a predetermined sequence.

In a preferred embodiment, the fixation elements are provided with a separate recipient area for each small component so that the fixation element can also protect the small component during handling.

In another preferred embodiment, the magazine base carrier is provided with through-going recipient openings which form the recipients for the fixation elements for holding small components. Fixation elements for small components are inserted in these recipient openings in an interlocking and stressfree and/or material conform manner, e.g. by means of gluing or adhesion.

One fixation element or multiple fixation elements or a group of fixation elements can be assigned to each recipient.

Furthermore, the diameters of the recipient openings in the magazine carrier and, therefore, of the fixation elements can be classified into several different, possibly standardized, size categories.

The invented magazine is suited for a number of applications: by way of illustration, it is suited for storing small components in micro electronics, micro system technology, light engineering and optics. Furthermore, small components and preparations used in the fields of pharmacy, biology, chemistry, etc. can be stored, with the special advantage that the holding force can be adapted to the respective to-be-stored small components by selecting the fixation element.

An example of the universal applicability of the invented magazine is storing small optical components, such as lenses, rod lenses, prisms etc., like those utilized, e.g., in endoscopes.

In the case of lenses, by way of illustration, they can be inspected or processed inside the magazine, by way of illustration, providing them with anti-reflex coatings. For this purpose, it is preferred if a moving unit is provided which supports the stored small components during processing steps and/or moves them axially for inspection and/or removal steps: by way of illustration, in inspection of optical surfaces, the to-be-inspected surface can be moved always in the focal point of the inspection device.

In addition, the, in relation to the recipient, axially moving unit permits automated removal of the components without auxiliary means.

In any event, it is an advantage if the moving unit is an electrically, pneumatically or hydraulically operated unit controlled by a control unit.

Of course, the invented magazine permits storing, magazining any parts, especially preferred is however if it is used for parts whose dimensions range in size up to about 10 mm; this is, by way of illustration, the maximum diameter of lenses respectively rod lenses in endoscopes.

Furthermore, the diameter of the fixation elements can be standardized. For each of these standardized diameters respectively recipient openings, a defined number of small components can be disposed on the basic magazine and can also be exactly spaced from each other. In this way, programmable assignment of the small components to a defined location and spatial alignment is possible, therefore, permitting automated production and processing without requiring any additional measures.

Automated handling is further supported in that the magazine base carrier is provided with identification means which permit identification of the magazine and/or of the small components fixed therein. This identification means can comprise mechanical coding, bar codes, magnetic coding and/or plain writing coding.

As the size of the diameter of the recipient openings in the magazine base carrier respectively the fixation elements is independent of the size of the magazine base carrier, the magazine base carrier respectively its frame can be adapted at any time to the usual standards in micro system technology and light engineering. Thus, the frame with the magazine base carrier can be integrated, by way of illustration, in the handling and transport systems, for instance in the SMIF box (standard mechanical interface).

The invented magazine for small components can, therefore, be integrated in already existing production processes in which corresponding adaptation of the exterior dimensions occurs.

The fixation elements together with the small parts are secured in a releasable manner in each recipient opening in such a manner that replacement of fixation elements with the small component or solely of the small component can occur at any time, for instance if a small component is flawed.

Another advantage of the invented magazine is that the fixation element for small components comprises a basic frame. The interior wall of this basic frame partially encompasses a recipient area for the small components. This recipient area bears securing means for the small components. The exterior wall of the basic frame is provided with a function surface for interlocking and/or stressfree and/or material conform connection of the fixation elements with the recipient openings of the magazine base carrier. In addition, with regard to height, the basic frame of the fixation elements can be held very flat.

Very different means of securing of these small components can be built into the recipient area of the fixation element depending on the demands of the respective application:

The securing means for the small components may be designed as gripper fingers, with the gripper fingers comprising a gripper section with a gripper surface, a bridge and a securing part at the interior wall of the round frame. The gripper section of these securing fingers can be formed component specific. Thus, the retaining element can cover only a very small part of the surface of the to-be fixed small component.

Due to the flat design of the fixation element respectively of the basic frame and the specific design of the gripper fingers for holding the small components, the small components can be inspected and cleaned inside the basic carrier practically from all sides, and, in particular, can be conveyed to automated processing inside the basic carrier. Therefore, the small components do not have to be removed from the fixation element nor from the magazine base carrier during double side processing on automated production lines.

Thus, the invented magazine is designed in such a manner that it can meet the demands of all production steps without alterations and obviates all additional handling measures during the automated production. The small components can be processed during assembly without changing the fixation position in the fixation element respectively in the magazine base carrier. As the securing means are predominantly made of an elastic material, placement into the magazine and removal from the magazine can, by way of illustration, be automatically carried out directly by a tool for the small component during processing on the production line.

As a securing means for the small components in the recipient area of the fixation element, snap noses can be disposed on the interior wall of the basic frame in interaction with retaining rings or retaining projections.

Furthermore, a suited magnetic force on the interior wall of the basic frame of the fixation element can also serve as the securing means. This magnetic force can also interact with a corresponding retaining ring or retaining projection for the small components.

Another construction of the securing means for small components in the recipient area of the fixation element comprises an axle, which serves to receive the small components, with at least one and, in particular, two snap noses for the fixation of the small component being provided on the tip of the axle.

In another variant of the present invention, the basic frame can be divided, with the securing means being built as two semi-circular disks which are integrated in the basic frame. These two semi-circular disks are provided with a hole for holding a small component, such as by way of illustration an axle, which is also held in a resilient manner there. The described preferred embodiments of the various securing means show that with the magazine base carrier small components of a very different shapes can be processed in automated production from fabrication to inspection as well as cleaning. The securing of the small components in the fixation element and of the fixation elements in the magazine base carrier permits as quick as possible removal of the individual small components with the least work input although the small components are held in the magazine in such a manner that processing them can occur inside the magazine base carrier.

Furthermore, the basic frame of the fixation element does not have to encompass the small component and the small component does not have to come directly in contact with the magazine base carrier.

BRIEF DESCRIPTION OF THE DRAWING

In the following the present invention is made more apparent using preferred embodiments with reference to the drawing, show in.

DESCRIPTION OF PREFERRED EMBODIMENTS

Figures 1, 1A, 1B, 1C:
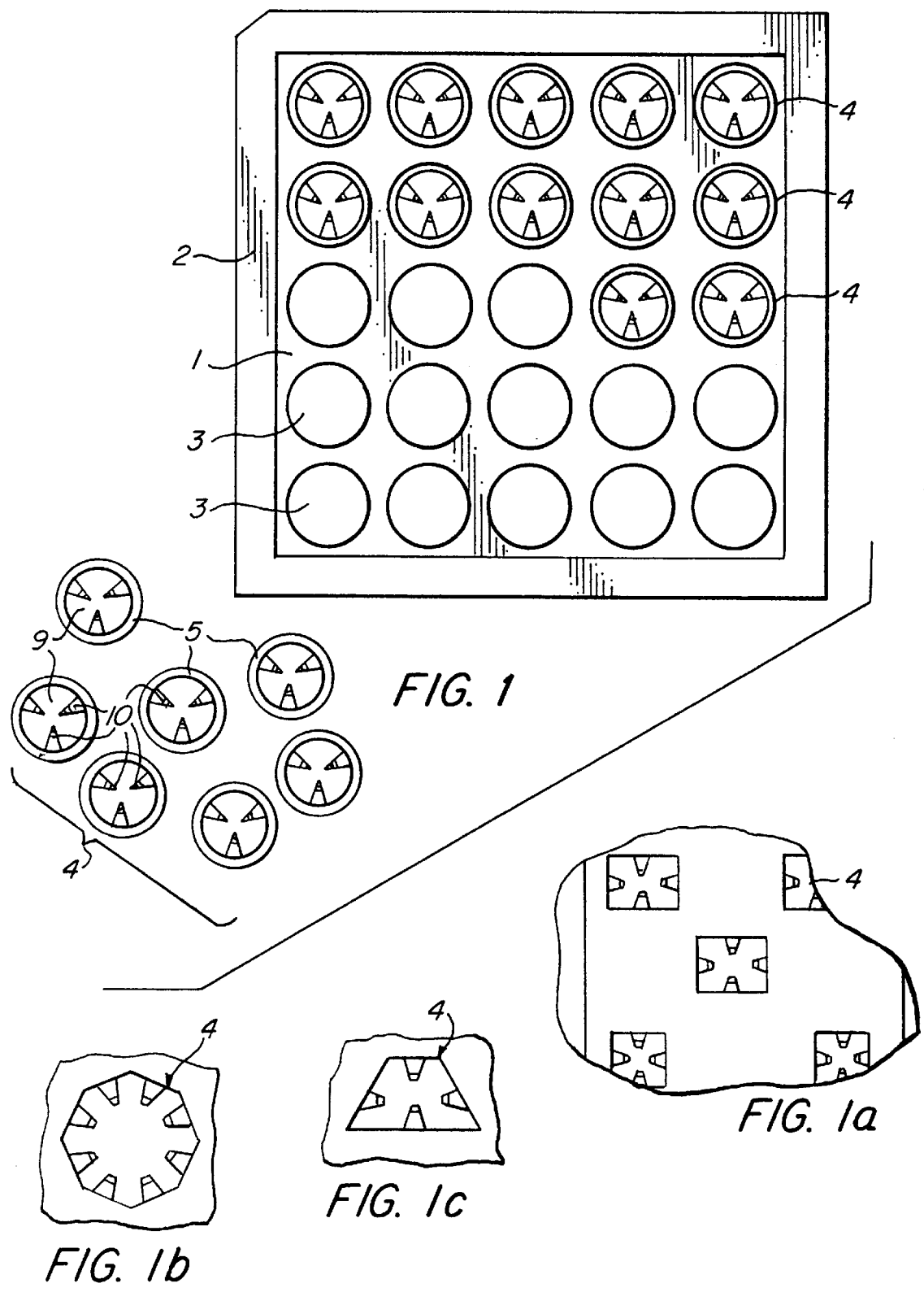
FIG. 1 a top view of a first preferred embodiment of a magazine for the fixation of small components designed according to the present invention.
FIG. 1a is a top view of a matrix composed of fixation elements having a polygonal shape selected from the group consisting of rectangular and square shape.
FIG. 1b is a top view of a receptacle element having an octagonal shape.
FIG. 1c is a top view of a receptacle element having a trapezoidal shape.
Figure 1D:
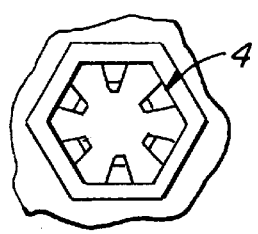
FIG. 1d is a top view of a receptacle element having a hexagonal shape.
Figure 1E:
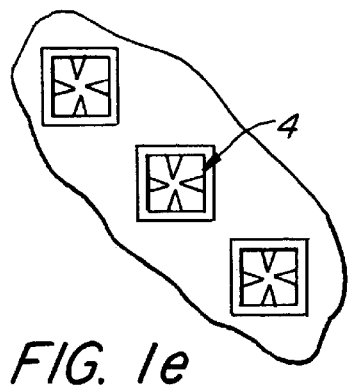
FIG. 1e is a top view of a plurality of receptacle elements arranged in a linear pattern.
Figure 1F:
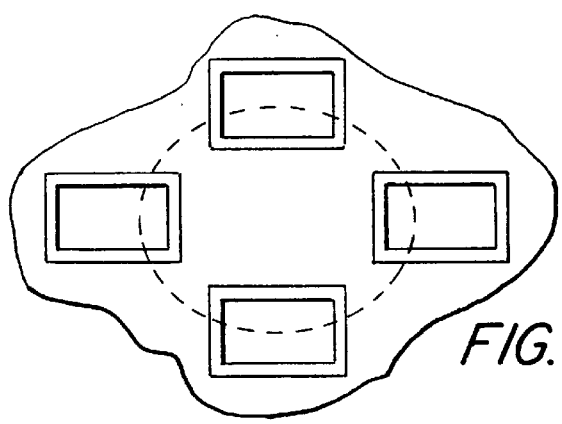
FIG. 1f is a top view of a plurality of receptacle elements arranged in a linear manner.
Figure 1G:
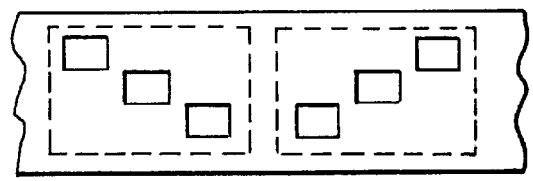
FIG. 1g is a top view of a transporter with a plurality of magazines of FIG. 1f inserted therein.
Figure 1H:
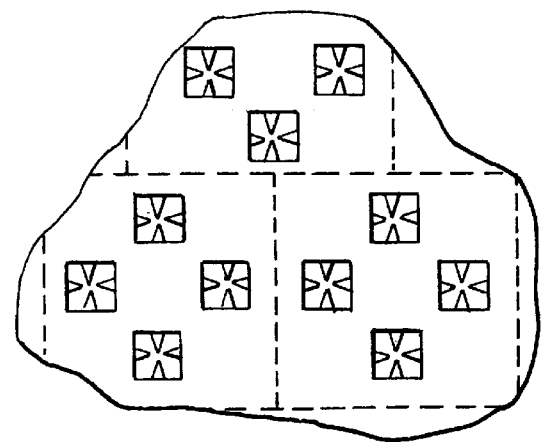
FIG. 1h is a top view of a large unit including several magazines of FIG. 1a, FIGS. 2a and b fixation elements having securing means designed as gripper fingers, FIGS. 3 and 4 an enlarged detail of the gripper fingers, FIG. 5 the automated placement of a small component in the fixation element with gripper fingers, FIG. 6 another preferred embodiment of a fixation element with securing means, which are designed as snap noses, FIGS. 7 and 8 other preferred embodiments of fixation elements, which operate with magnetic force as holding force, FIG. 9 another preferred embodiment of a fixation element, which is provided with an axle for small components, and FIGS. 10 and 11 another preferred embodiment of a fixation element and securing means, which are designed divided.

FIG. 1 shows a top view of the fundamental design of a magazine for the fixation of small components built according to the present invention. The small components, as already explained in the preceding, may be any parts, such as by way of illustration small components in micro systems technology or light engineering. FIGS. 2 to 11 show details of the design of a magazine built according to the present invention. It is explicitly pointed out that for lucidity and clarity, part of the representations in FIGS. 2 to 11 is considerably enlarged in comparison to FIG. 1 and to the actual dimensions of an invented magazine.

The magazine comprises a magazine base carrier 1, a frame 2 and recipients 3 for fixation elements 4. In the depicted preferred embodiment, the recipients are designed as completely through-going recipient holes 3 for the fixation elements 4. The design of the recipients as "through-going" recipient holes are a preferred embodiment, but not an absolutely required embodiment: therefore, the recipient may also be designed as a type of "pocket hole" or as a recess.

In the recipient openings 3, the small components, which are secured in fixation elements 4, can be stored in a certain predetermined geometric arrangement given by the recipient openings 3 on the surface of the magazine base carrier 1. In the depicted preferred embodiment, the recipient openings 3 for the fixation elements 4 are disposed "matrix-like" in the intended points of intersection respectively of a grid pattern which is formed by the adjacent and equal squares. Of course, other arrangements of the recipient openings 3 are also possible: for instance, the "matrix" may be composed of rectangles or of a "honeycomb" of hexagons. The spacing can be adapted to the size of the parts to be stored and/or other parameters required for automated production.

However, the arrangement of the recipient openings 3 in the magazine base carrier 1 should advantageously be selected in such a manner that they can be fed into a control unit in a simple manner and, in particular, that they can be programmed into a control unit, which regulates loading the magazine with small components and/or removing the small components. To do so, proceeded may be, by way of illustration, as follows:

As only a defined number of recipient openings 3 can be accommodated in a row respectively on the entire surface of the magazine base carrier 1, an exactly defined distance between the small components in the fixation elements 4 is yielded. The distance between the small components in the fixation elements 4 respectively the recipient openings 3 in the magazine base carrier 1 is varied also by classifying the diameter of the recipient openings 3 and analogously the diameter of the fixation elements 4 in several different size categories of diameters of the recipient openings 3 respectively of the fixation elements 4 and therefore standardization of the existing diameters of the recipient openings 3 respectively of the fixation elements 4.

In electronics, micro system technology and light engineering, the to-be-stored small components range in size up to about 10 mm. This range or another one useful for the respective application is divided into a few size categories in order to obtain optimum support for the small components in the fixation elements 4. Usually, it is useful if each magazine base carrier 1 is provided with only one size category for the diameters of the fixation elements 4 respectively of the recipient openings 3. However, for specific applications, recipients 3 respectively recipient openings of different sizes respectively diameters can be disposed in a base carrier 1. In any event, fixed spacing of the small components respectively of the fixation elements 4 is yielded in dependence on the exterior dimensions of the frame for the magazine base carrier 1 for the selected standard size of the recipient openings 3 respectively of the fixation elements 4.

As the size of the diameter of the recipient openings 3 respectively of the fixation elements 4 is not dependent on the size of the magazine. base carrier 1, frame 2, which surrounds the magazine base carrier 1, can also be executed in multiple same and also standardized sizes. The size of frame 2 and therefore of the magazine base carrier 1 is adapted to the already employed magazine sizes for the respective components, such as by way of illustration electronic components, used in existing transport and handling systems.

Thus, by way of illustration, a handling and transport system for trays according to the SMIF standard (standard mechanical interface) is known to whose configuration the present invention with its magazine frame respectively magazine base carrier can be adapted. This is a precondition that not only parts can be stored and magazined in the invented magazine, but that the magazine built according to the invented design can also be integrated at any time into the already existing production systems. The size of the frame and therefore the exterior contour of the magazine is preferably independent of the shape and size of the small components to be stored.

The design of the fixation elements 4 of the first preferred embodiment shown in FIG. 1 is made more apparent in the following with reference to the detail in FIG. 1 and in FIGS. 2 to 5:

Each fixation element 4 for holding a small component comprises a basic frame 5 and securing means, which will be dealt with more closely in the following. Each basic frame 5 of a fixation element 4 possesses an exterior wall 6, which serves as a function surface for an interlocking, stressfree, and/or material conform (by way of illustration by means of gluing) connection of the fixation elements 4 to the recipient openings 3 in the magazine base carrier 1.

In order to produce an interlocking and/or stressfree connection between the recipient opening 3 and the basic frame 5, the latter can be provided on its exterior wall 6 with a groove or bead running around it, which snaps resiliently into a recipient opening 3. This type of connection is not depicted in the drawing. In order that the basic frame 5 can snap resiliently into a recipient opening 3 and in order that each fixation element 4 with its basic frame 5 can be detached from the magazine base carrier 1 at any time and thus, for example, can be replaced, the material of the basic frame 5 is made of a resilient material. Metal, plastic or magnetic material, which each possess resilient properties, may be selected as the material for the basic frame.

Metal, plastic or magnetic material can also be selected as the material for the magazine base carrier 1. The choice of material is also determined for the basic frame 5 as well as the magazine base carrier 1 by the respective use of the magazine for small components. Thus, for instance, if the magazine is used for cleaning the small components stored in it, suited materials, which prevent corrosion of these parts when wetted with the cleaning fluid, are selected for the basic frame 5 and the magazine base carrier 1.

The basic frame 5 and the recipient openings 3 in the magazine base carrier 1 and therefore the fixation elements 4 can possess any shape: by way of illustration, they may be circular, square or rectangular, trapezoid or hexagonal in shape. However, other shapes of the recipient openings 3 and of the basic frame 5 of the fixation element 4 are also possible, shapes which are adapted to the shape of the to-be-stored and, if need be, to-be-processed small components in the fixation elements of the magazine.

The basic frame 5 and therefore the fixation elements 4 are preferably executed in such a manner that they only possess a small height 7. This also applies to the thickness of the magazine base carrier 1. The described flat construction of the basic frame 5 and of the magazine base carrier 1 permits good access from almost all sides to the stored small component. This is essential with regard to inspection, cleaning and coating as well as production and processing of small components. Especially advantageous is the flat construction, if the accommodated small components are to be processed inside the magazine base carrier 1 respectively in the fixation elements 4.

The basic frame 5 of each fixation element 4 possesses an interior wall 8 which at least partially encloses a recipient area 9 for the small components. Securing means for the small components are provided in the recipient area 9 of the fixation element 4.

In the first preferred embodiment of the securing means of the small components in the recipient area 9 of the fixation element 4, the latter are designed as gripper fingers 10. Each gripper finger 10 is composed of one gripper section 11 with a gripper surface 12, a bridge 13 and a securing component 14 at the interior wall 8 of the basic frame 5.

Figure 2A:
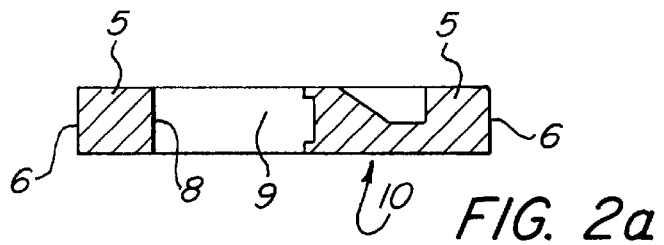
Figure 2B:
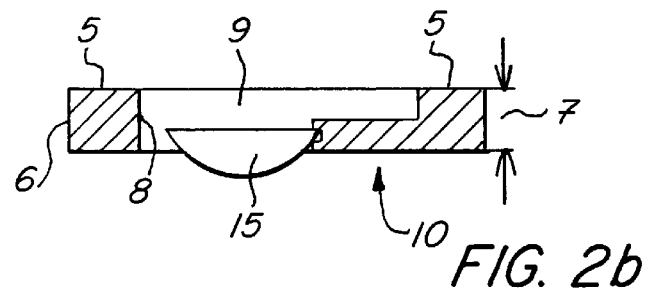
Figure 3:
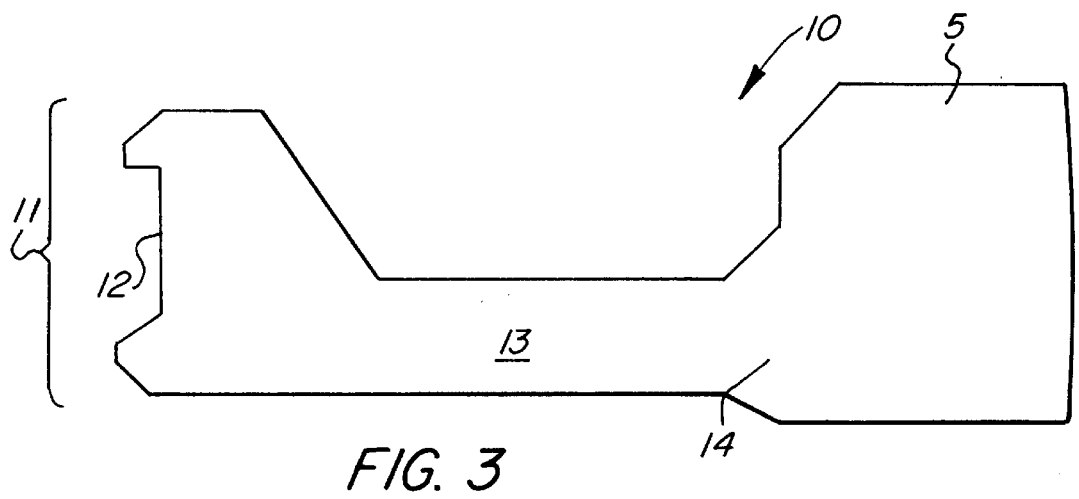
Figure 4:
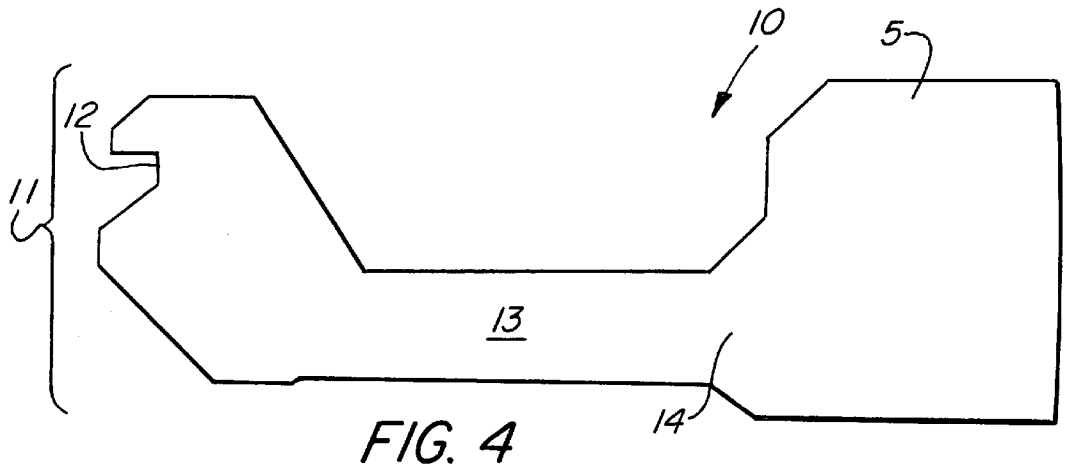
Figure 5:
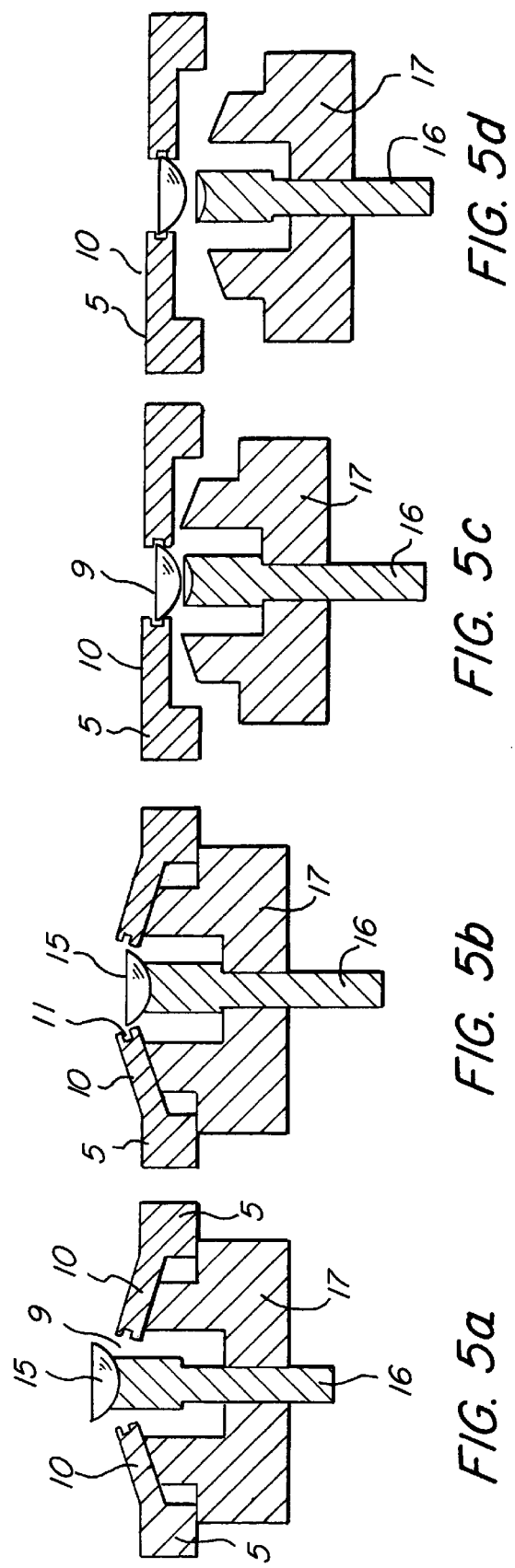

Thus, the gripper fingers 10 are component specific securing means. Both the gripper section 11 and the gripper surface 10, as can be clearly seen in FIGS. 2 and 3, are adapted to the outer shape of the to-be-stored small components respectively to the force required for holding; the small components in FIGS. 2b and 5 are only depicted schematically. Naturally, the present invention is not limited to the storing of the depicted relatively simple parts.

The gripper fingers and the other securing means of the fixation elements 4 except for the magnetic materials are made of a resilient material, which returns to its initial state after elastic deflection. This statement also applies to the other preferred embodiments of the securing means described in the following. The number of gripper fingers 10 in the recipient area 9 for small components, which are secured to the interior wall 8 of the basic frame 5, are limited. Although, if there is enough room, 1 to n such type gripper fingers 10 can be disposed, the number is usually kept so small that the to-be-stored small components remain laterally easily accessible. The intermediate space between the gripper fingers 10 and the two sides of the magazine should, in particular if the small components are to be cleaned or coated inside the magazine, permit practically complete washing of the to-be-cleaned respectively to-be-coated small components with the cleaning fluid respectively coating medium. Moreover, good inspection capability of the stored small components should be maintained.

The gripper fingers 10, utilized according to the present invention, of the fixation element 4 permit a defined spatial fixation and a defined location of the small components with the smallest possible contact area of the gripper fingers 10 on the small component. The gripper fingers 10 are also made of an elastic material, they can be executed one-piece in conjunction with the basic frame 5. The elastic properties of the gripper fingers, which in particular are also supported by the bridge 13, permit any number of loading and removal of small components with the aid of production-specific removal devices.

FIGS. 2b and 5, as previously mentioned, depict a very =simplified small component. As these figures particularly show, the elastic gripper fingers 10 permit placing small components in the recipient area 9, removing them as well as processing them.

All these procedures can be carried out automated in production lines such as are used by way of illustration in electronical engineering, light engineering and/or optical engineering.

The invented magazine respectively the interaction of the fixation elements with the securing means with the small components permits, following initial storing of the small component in an exactly defined location and in precise alignment of the position of the small component, maintaining this originally fabricated and ordered state of the small component even in production steps, e.g. inspection, cleaning and the like, because processing of production steps of the small components can be carried out even after securing the small components inside the magazine. Therefore, it is not necessary, as was hitherto the case, to transfer the small components to a special magazine for the further processing steps and procedures.

This is made more apparent with reference to FIG. 5: FIG. 5a shows how a small component 15 is placed in the fixation device 4 using a tool 16, which is only partly depicted here and by way of illustration can be designed as a suction gripper, however any other design of the tool can be employed. Used for this purpose can be an auxiliary means 17, which has raised the elastic gripper fingers 10 in such a manner that an enlarged opening for the reception of the small component 15 is created. Now with the tool 16, designed as a suction gripper, the small component 15 is grasped and placed in the gripper section 11 of gripper fingers 10 by lowering the suction gripper. At the same time, the auxiliary means 17 is drawn downward in such a manner that the elastic gripper fingers 10 are able to return to their initial state as shown in FIGS. 5c and 5d.

Regarding the representation of FIG. 5 in reverse order, that is from FIG. 5d to FIGS. 5c, 5b and 5a, yields a representation of the removal of the small components 15, which occurs in reverse order to loading.

Placing and removing the small components 15 may, of course, also occur from the other side of the fixation element 4, thus as in the representation from the top. The design of the fixation element 4 permits totally free removal of the component from the magazine using a suited tool, i.e. neither the small component nor the fixation element suffers wear. Moreover, the component may also be mounted directly on a not depicted mounting point on the other side of the magazine, as FIG. 5a shows. However, the small component 15 can also be directly processed without additional handling and alteration in the course of automated production between the individual production steps.

As FIG. 5d shows, the existing, ordered location of the small components from the original storing can be utilized in order to process the small component respectively assembly it with other parts while the small component is fixed inside the magazine. This is possible because the gripper fingers 10 are elastic and because the small component in the position 5d can be supported at any time from one side by means of a stamp and processed from the other side. This processing procedure can, of course, be carried out in reverse from the other side in a second step with the stamp and tools exchanged.

The design of the fixation elements 4 with gripper fingers 10 as securing means in the magazine base carrier 1 also permits removing defect small components at any time from the production process immediately upon detection. This can be done by removing the defect small components 15 from the fixation element 4 or by direct replacement of the fixation element 4 in the magazine base carrier 1 in which the fixation element 4 is secured in a releasable manner.

With the magazine according to the present invention, a defect fixation element 4 can also simply be replaced without having to purchase a completely new magazine or having to integrate a completely new magazine in the production process.

Due to the described processing possibilities, as well as the previously mentioned ability to inspect, process, coat and clean the small components, the invented magazine becomes, based on its versatile application in the production and assembly, a means that permits saving time and reducing handling of the small components in the production and ultimately reducing production costs of small components in micro system technology and light engineering.

In the first preferred embodiment of the securing means for the fixation elements 4, in which the gripper fingers 10 serve as securing means, the small component held in the fixation element 4 is especially easily accessible, i.e. there is the greatest possible accessibility to the small component from both sides of the magazine, because the fixation elements 4 respectively the basic frame 5 as well as the securing means in the form of the gripping fingers 10 is maintained as flat as possible so that lateral access is even possible on a large scale in the acute angle.

Figure 6:
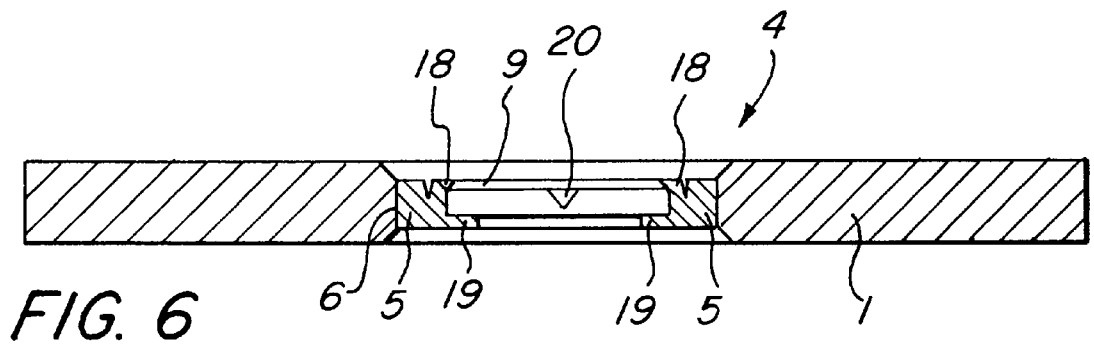

A second preferred embodiment of the securing means is shown in FIG. 6. The securing means depicted in FIGS. 6, 7, 8, 9, 10 and 11 fix small components which do not require lateral access in the acute angle to such an extent as the small components do which are held by the securing means in the form of gripper fingers 10.

For all the securing means applies that they are substantially influenced by the design and the properties of the to-be-fixed small components, by way of illustration by the capability and the shape of the gripper surface on the small component, by the firmness of the small-component and therefore the force with which the small component can be held respectively the holding force required to process the small component inside the magazine in the fixation elements 4.

In FIG. 6, the securing means for the small components in the recipient area 9 of the fixation element 4 is designed as snap noses 18 in interaction with a retaining ring 19 running round the interior wall of the basic frame 5 or in its stead not depicted retaining projections. The retaining ring 19 respectively in its stead the not depicted retaining projections are here the defined area that bears the small component 20. Thus the retaining ring 19 can serve as a base for the small component 20 for assembly and processing. It must be pointed out again that the small component 20 represents only a very simplified small component. The basic frame 5 and snap noses 18 connected to it one-piece is made of a resilient material so that pressing in the small component 20, until it rests on the retaining ring 19, the small component 20 is firmly grasped by the springing back securing means in the form of snap noses 18. The exterior wall 6 of the basic frame 5 for its part is designed as the function area for the interlocking and/or stressfree and/or material conform connection of the fixation element 4 with the recipient opening 3 in the magazine base carrier 1.

Figure 7:
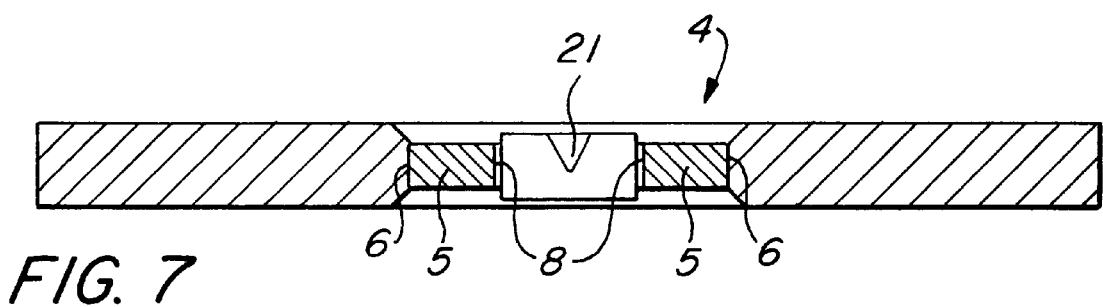
Figure 8:
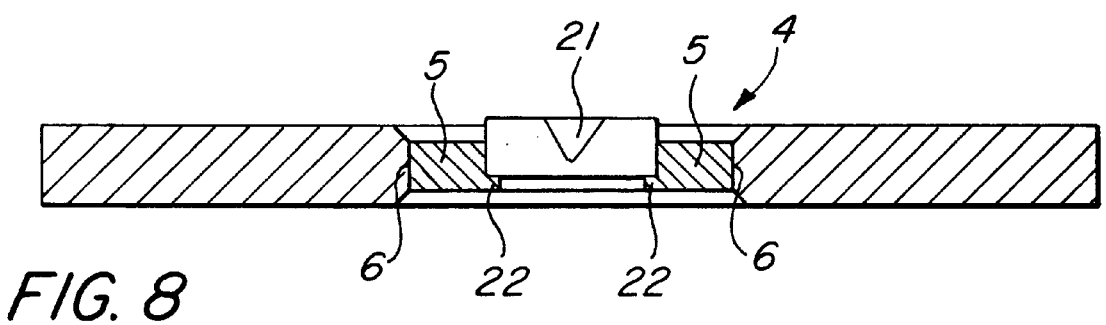

FIGS. 7 and 8 show other fixation elements 4, which operate with magnetic attraction force as the securing means. For suited small components 21, which are influenced by magnetic force, a basic frame 5 is provided which is made of a magnetic material. In the preferred embodiment for the securing means according to FIG. 7, fixation of the small component 21 is solely performed by contactless transmission of magnetic force between the magnetic basic frame 5 and the small component 21.

The securing means for the small components in the recipient area 9 of the fixation element 4 is designed as an interior wall 8 of the basic frame 5, to which the small components adhere by means of magnetic force.

In another preferred embodiment of a securing means with small components 21, which are influenced by magnetic force, in FIG. 8, the securing means for the small components in the recipient area 9 is provided designed as an interior wall 8, to which the small components adhere by means of magnetic force and, in addition, a retaining ring 22 or in its stead not depicted retaining projections for holding the small components. The retaining ring 22 or in its stead the retaining projections also serve to create a defined bearing area for the small component if during the processing of the small components 21, the forces are greater than the holding forces in the preferred embodiment for the securing means according to FIG. 7.

Figure 9:
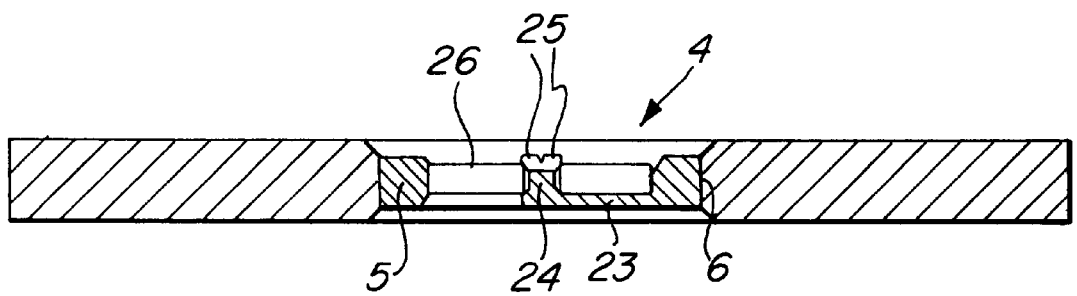

FIG. 9 shows another preferred embodiment of the securing means for small components in the recipient area 9 of the fixation elements 4. Here the securing means is designed as an axle 24 which is attached with at least one arm 23 to the interior wall 8 of the basic frame 5 for receiving the small component. The axle 24 bears at least one snap nose 25 for fixing the small component on the tip opposite the arm 23, with the small component 26 being provided with a borehole into which the axle 24 can engage. If the small component 26 is pressed onto the axle 24 down to the level of the arm 23, the snap noses 25 bend back and hold the small components 26 in the recipient area 9 of the fixation element 4. In this case, too, the exterior wall 6 of the basic frame 5 of the fixation element 4 is for its part used for the interlocking and/or stressfree and/or material conform connection between the fixation element 4 and the recipient opening 3 in the magazine base carrier 1.

Figure 10:
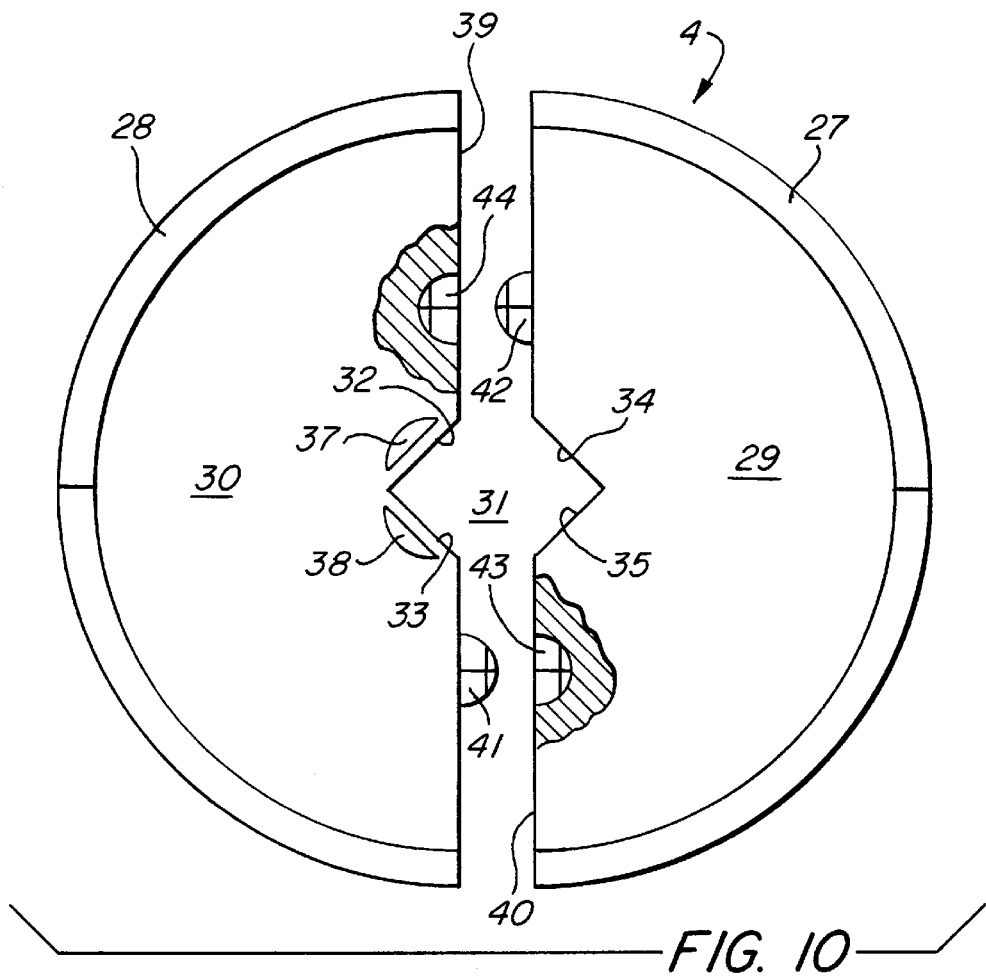
Figure 11:
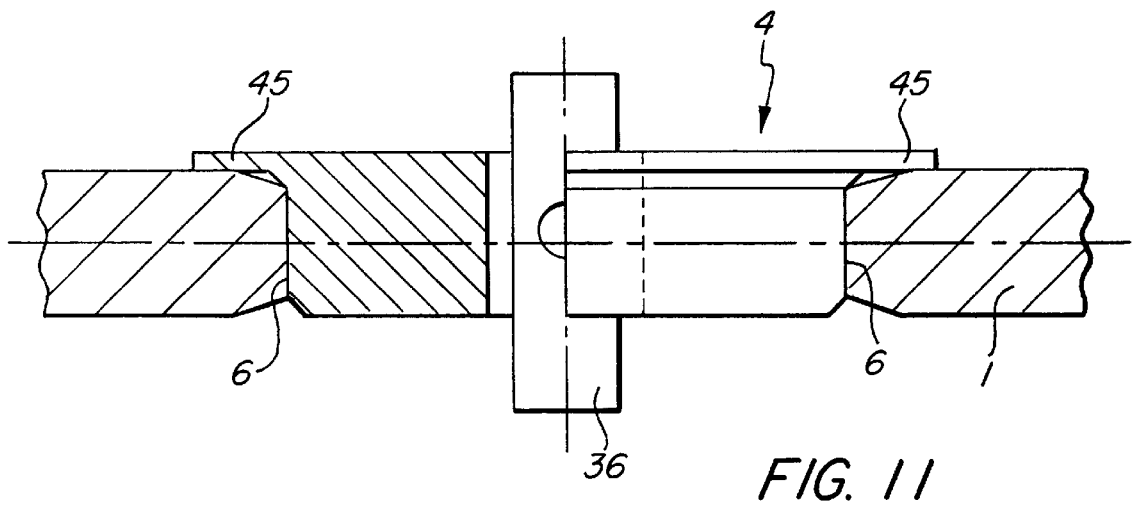

Another preferred embodiment for a securing means is shown in FIGS. 10 and 11. In this case, the basic frame 5 of the fixation element 4 is divided, in other words the basic frame 5 can be divided in two halves 27 and 28. Adjusting means, not depicted, which permit the two halves 26 and 27 to fit snugly, are provided for the two halves of the frame. In the preferred embodiment according to FIGS. 10 and 11, the semi-circular disks 29 and 30, which are integrated in the basic frame 5 respectively in its two halves 27 and 28, are executed as the securing means for the small components in the recipient area 9 of the fixation element 4. The two semi-circular disks 30 and 31 each form a half of a hole 31, which serves to hold a small component 36. Disposed behind at least one part of the side walls 32, 33, 34 and 35 of the hole 31 are hollow spaces 37 and 38 for achieving resilient clamping of the small component 36. As the securing means in the form of semi-circular disks 29 and 30 respectively their walls 32, 33, 34 and 35 is made of an elastic material, the small component 36 is held resiliently in the hole 31 by the walls of hole 31, which is executed smaller than the small component. Knobs 41 and 42 respectively recesses 43 and 44 are provided on/in the sides of contact 39 and 40 of the two semi-circular disks 29 and 30 for snug fitting joining of the two semi-circular disks 29 and 30 of the securing means.

FIG. 10 shows an enlarged representation only of the fixation element 4, whereas FIG. 11 shows the fixation element with the basic frame and the semi-circular disks 29 and 30 of the securing means in the utilized state in the magazine carrier 1. The basic frame 5 in the form of its two halves, just as in all the preceding preferred embodiments of the basic frame as the securing means, possesses exterior walls 6, which serve as function areas for interlocking and/or stressfree connections of the fixation element 4 with the recipient openings 3 of the magazine base carrier 1. Moreover, in the preferred embodiment of the securing means according to FIG. 11, a ring ridge 45 running round the exterior wall 6 of the basic frame 5 can be seen. This ring ridge is shaped to conform to the basic frame 5 respectively in the preferred embodiment of FIGS. 10 and 11 to the two halves 27 and 28 of the basic frame. The diameter of the ring ridge 45 is selected larger than the diameter of the recipient opening 3 for receiving the fixation element 4. This ring ridge 45 can be disposed on the fixation elements not only in the preferred embodiment with the divided basic frame according to FIG. 11. A ring ridge 45 can also be disposed on the basic frame 5 in the other described preferred embodiments. This ring ridge ensures that the basic frame 5 and therefore the fixation element 4 does not move in the recipient opening 3 of the magazine base carrier 1, which is of significance for certain processing procedures.

In the preceding, the present invention was described without the intention of limiting general applicability or the scope or spirit of the overall inventive idea, within which many different modifications are possible: for instance the cross section of the axle and the borehole may be other than round, by way of illustration square or hexagonal.

List of Reference Numbers

1 Magazine base carrier
2 Frame
3 Recipient opening
4 Fixation element
5 Basic frame
6 Exterior wall of the basic frame
7 Height of the basic frame
8 Interior wall of the basic frame
9 Recipient area of the small component
10 Gripper finger
11 Gripper section
12 Gripper surface
13 Bridge
14 Securing component
15 Small component
16 Tool
17 Auxiliary means
18 Snap noses
19 Retaining ring
20 Small component
21 Small component
22 Retaining ring
23 Arm
24 Axle
25 Snap noses
26 Small components
27 Half of the basic frame
28 Half of the basic frame
29 Semi-circular disk
30 Semi-circular disk
31 Hole
32 Wall of the opening
33 Wall of the opening
34 Wall of the opening
35 Wall of the opening
36 Small component
37 Hollow space
38 Hollow space
39 Side of contact
40 Side of contact
41 knob
42 Knob
43 Recess
44 Recess
45 Ring ridge

What is claimed is:

1. A magazine for receiving a plurality of small components comprising:
   a base carrier;
   at least one recipient in said base carrier and having an inner peripheral surface;
   at least one fixation element having a basic frame enclosing at least partly a recipient area and formed with an outer peripheral surface which creates an interlocking and stressfree connection with the inner peripheral surface of the at least one recipient to enable the at least one fixation element to be removably attached to the at one recipient; and
   a securing element attached to one said fixation element for releasably locking a respective small component in one said recipient.

2. The magazine defined in claim 1 wherein the base carrier has a plurality of recipients, each being identical to one another and being an opening.

3. The magazine defined in claim 2 wherein the recipients are arranged in a pattern selected from the group consisting of a circular, honeycomb, and linear arrangement.

4. The magazine defined in claim 1 wherein the basic frame has an inner wall enclosing the recipient area which receives the small component.

5. The magazine defined in claim 1 wherein the outer surface of one said fixation element has a peripheral groove receiving the inner surface of its one said recipient.

6. The magazine defined in claim 1, further comprising a peripheral ring ridge mounted on the exterior surface of the basic frame and having an outer diameter which is larger than a diameter of one said recipient.

7. The magazine defined in claim 1 wherein the securing element includes a plurality of angularly spaced gripper fingers extending inwardly toward one another in the recipient area, each of the gripper fingers having a free end which is provided with a formation engaging the small component upon locking thereof with one said fixation element.

8. The magazine defined in claim 7 wherein said gripper fingers are made of a resilient material to elastically deform upon inserting the small component, the gripper fingers returning to an initial position thereof upon insertion of the small component and exerting a force directed radially outwardly to cause the outer surface of one said fixation element to press against the inner surface of its one said recipient.

9. The magazine defined in claim 7 wherein each of the formations is a recess receiving the outer surface of one said recipient.

10. The magazine defined in claim 7 wherein the gripper fingers are made unitarily with the basic frame, each of the gripper fingers further including a bridge connecting the basic frame with the free end extending complimentary to a segment of an outer surface of the small component.

11. The magazine defined in claim 7 wherein thesformation is a collar which has a recess allowing the gripper finger to exert a force directed radially outwardly upon engaging of the small component to press the enter surface of one said fixation element against the inner surface of one said recipient.

12. The magazine defined in claim 7 wherein the formation is a bottom lip extending from the free end of each gripper finger to support the small component.

13. The magazine defined in claim 7 wherein each gripper finger is made of magnetic material.

14. The magazine defined in claim 1 wherein at least one recipient thorough is a hole aligned with an actuator for displacing the small component into the hole.

15. The magazine defined in claim 1 wherein the outer surface of one said fixation element extends complimentary to the inner surface of its one said recipient and has a cross-section selected from the group consisting of a square, rectangular, hexagonal, octagonal and circular cross-section.

16. The magazine defined in claim 1 wherein the basic frame includes at least two separate parts facing one another, the securing element including two recesses each formed on a respective said part to define the recipient area therebetween.

17. The magazine defined in claim 16 wherein one of the at least two separate parts has at least one indentation and another said part having at least one knob registered with the one indentation, each of the separate parts being elastically deformable upon insertion of the small component into the recipient area to press the outer surface of one said fixation element against the inner surface of its one said recipient.

18. The magazine defined in claim 17 wherein each of the separate parts has a hollow space.

19. The magazine defined in claim 1 wherein the base carrier has an indicator selected from the group consisting of a mechanical, magnetic and plain coding and bar codes.

* * * * *

UNITED STATES PATENT AND TRADEMARK OFFICE
CERTIFICATE OF CORRECTION

PATENT NO. : 6,164,448

DATED : December 26, 2000

INVENTOR(S) : Wolfgang Schumtz et al.

It is certified that error appears in the above-identified patent and that said Letters Patent is hereby corrected as shown below:

ON THE TITLE PAGE

[73] Assignee: Frauhofer - Gesellschaft Zur Forderung Der Angewandten Forschung E.V., Munich, Germany; Karl Storz GmbH & Co. KG., Tuttlingen, Germany; ACR Automation In Cleanroom Dresden GmbH, Dresden, Germany Institut Fur Mikrotechnik Mainz GmbH; Mainz, Germany.

Signed and Sealed this

Twenty-ninth Day of May, 2001

Attest:

NICHOLAS P. GODICI

Attesting Officer

Acting Director of the United States Patent and Trademark Office